(12) United States Patent
Wiley

(10) Patent No.: US 9,362,950 B2
(45) Date of Patent: Jun. 7, 2016

(54) HIGH PERFORMANCE CRC CALCULATION WITH SMALL FOOTPRINT

(71) Applicant: Infineon Technologies AG, Neubiberg (DE)

(72) Inventor: Edward Wiley, Howell, MI (US)

(73) Assignee: Infineon Technologies AG, Neubiberg (DE)

( * ) Notice: Subject to any disclaimer, the term of this patent is extended or adjusted under 35 U.S.C. 154(b) by 105 days.

(21) Appl. No.: 14/267,991

(22) Filed: May 2, 2014

(65) Prior Publication Data
US 2015/0318867 A1 Nov. 5, 2015

(51) Int. Cl.
*H03M 13/00* (2006.01)
*H03M 13/09* (2006.01)
*G06F 11/10* (2006.01)

(52) U.S. Cl.
CPC ......... *H03M 13/091* (2013.01); *G06F 11/1004* (2013.01)

(58) Field of Classification Search
CPC ............ H03M 13/091; H03M 13/616; H03M 13/093; H03M 13/6516; H03M 13/09; H03M 13/158; H03M 13/096; G06F 11/1004; G06F 9/30018; G06F 9/3861; G06F 9/3885; H04L 1/1829; H04L 1/0061; H04L 1/0043; H04L 2012/5674; H04L 1/0041; H04L 9/0631
See application file for complete search history.

(56) References Cited

U.S. PATENT DOCUMENTS

| 5,155,487 A * | 10/1992 | Tanaka | H03M 13/091 341/100 |
| 7,360,142 B1 * | 4/2008 | Barash | H03M 13/09 714/758 |
| 7,434,150 B1 * | 10/2008 | Barash | H03M 13/091 714/807 |
| 8,225,187 B1 * | 7/2012 | Schultz | G06F 11/1004 714/807 |
| 2005/0005224 A1 * | 1/2005 | Ridgeway | H03M 13/6516 714/758 |
| 2005/0097432 A1 * | 5/2005 | Obuchi | H03M 13/091 714/800 |
| 2005/0204263 A1 * | 9/2005 | Ricci | H03M 13/616 714/758 |
| 2011/0231636 A1 * | 9/2011 | Olson | H03M 13/158 712/222 |

OTHER PUBLICATIONS

Stavinov, Evgeni. "A Practical Parallel CRC Generation Method." Circuit Cellular, Issue 234, Jan. 2010.

* cited by examiner

*Primary Examiner* — Guerrier Merant
(74) *Attorney, Agent, or Firm* — Eschweiler & Associates, LLC

(57) ABSTRACT

A cyclic redundancy check (CRC) can be determined with fewer resources within a communication system. A CRC interface component is configured to receive an array of bits as an input via an N-bit data pathway, and receive a CRC previous output from a feedback component coupled to a CRC output, in which N can comprise an integer greater than one. A parallel CRC component can be configured to generate a CRC current output from a plurality of parallel processing pipelines that are configured to concurrently process at least a part of the array of bits and the CRC previous output with a set of parallel CRC logic operations. The set of CRC logic operations can include a masking operation and a parity operation.

19 Claims, 8 Drawing Sheets

```
/*
 * Parallel CRC-3 generation for polynomial X^3 + X^1 + 1
 * SPI frame is 32-bits, with 29-bits of data and 3-bit CRC:
 *   SPI_frame[31] --> data_in[28], included in CRC calc
 *   SPI_frame[30] --> data_in[27], included in CRC calc
 *   ...
 *   SPI_frame[3] --> data_in[0], included in CRC calc
 *   SPI_frame[2] --> input ignored, internally used for CRC[2] init value
 *   SPI_frame[1] --> input ignored, internally used for CRC[1] init value
 *   SPI_frame[0] --> input ignored, internally used for CRC[0] init value
 */

/* Mask value placed in RAM for faster access */
uint32 c0_mask = 0x9d3a74ecU;
uint32 c1_mask = 0xa74e9d3dU;
uint32 c2_mask = 0x4e9d3a72U;
#define CRC_POPT_MSG_MASK 0xFFFFFFF8U /* only keep data_in bits of SPI frame */
/* Initial non-direct value 0x7 converted to direct value 0x2 */
#define CRC_POPT_RESULT_INIT 0x2U
define CRC_POPT_RESULT_MASK 0x7U /* Optimized version of parallel CRC */
uint8 Calc_CRC3_Optimized_Parallel(uint32 SPI_frame)
{
   uint32 crc;

SPI_frame &= CRC_POPT_MSG_MASK;
   SPI_frame |= CRC_POPT_RESULT_INIT;

/* __parity() calculates parity of each byte, and places parity result
    * at lsb of each byte */
   crc = __parity(SPI_frame & c0_mask);
   crc |= (__parity(SPI_frame & c1_mask) << 1U);
   crc |= (__parity(SPI_frame & c2_mask) << 2U);

crc = ((crc >> 16U) ^ crc); // fold by 16
   crc = ((crc >> 8U) ^ crc); // fold by 8, lowest byte now holds parity of c2, c1, c0 return ((uint8)crc);
}
```

FIG. 6

HIGH PERFORMANCE CRC CALCULATION WITH SMALL FOOTPRINT

BACKGROUND

Many communication channels are subject to channel noise, and thus errors may be introduced during transmission from the source to a receiver. Error detection techniques enable detecting such errors, while error correction enables reconstruction of the original data after transmission. A cyclic redundancy check (CRC) is an example of error-detecting processes utilized in digital networks, sensor networks, detecting accidental changes in raw data, and various communication systems. Blocks of data entering these systems can get a short check value attached thereto based on the remainder of a polynomial division of the contents. Upon retrieval, the calculation is repeated, and corrective action can be taken against presumed data corruption when the check values do not match. CRC codes or CRCs can be simple to implement in binary hardware, easy to analyze mathematically, and are particularly good at detecting common errors caused by noise in transmission channels. However, software based CRC calculations can potentially consume significant amounts of processing time, or large amounts of memory, and may exceed the limited resources available in most embedded microcontroller systems.

BRIEF DESCRIPTION OF THE DRAWINGS

FIG. 6 illustrates an example abstract coding process for generating parallel CRC.

DETAILED DESCRIPTION

Figure 1:
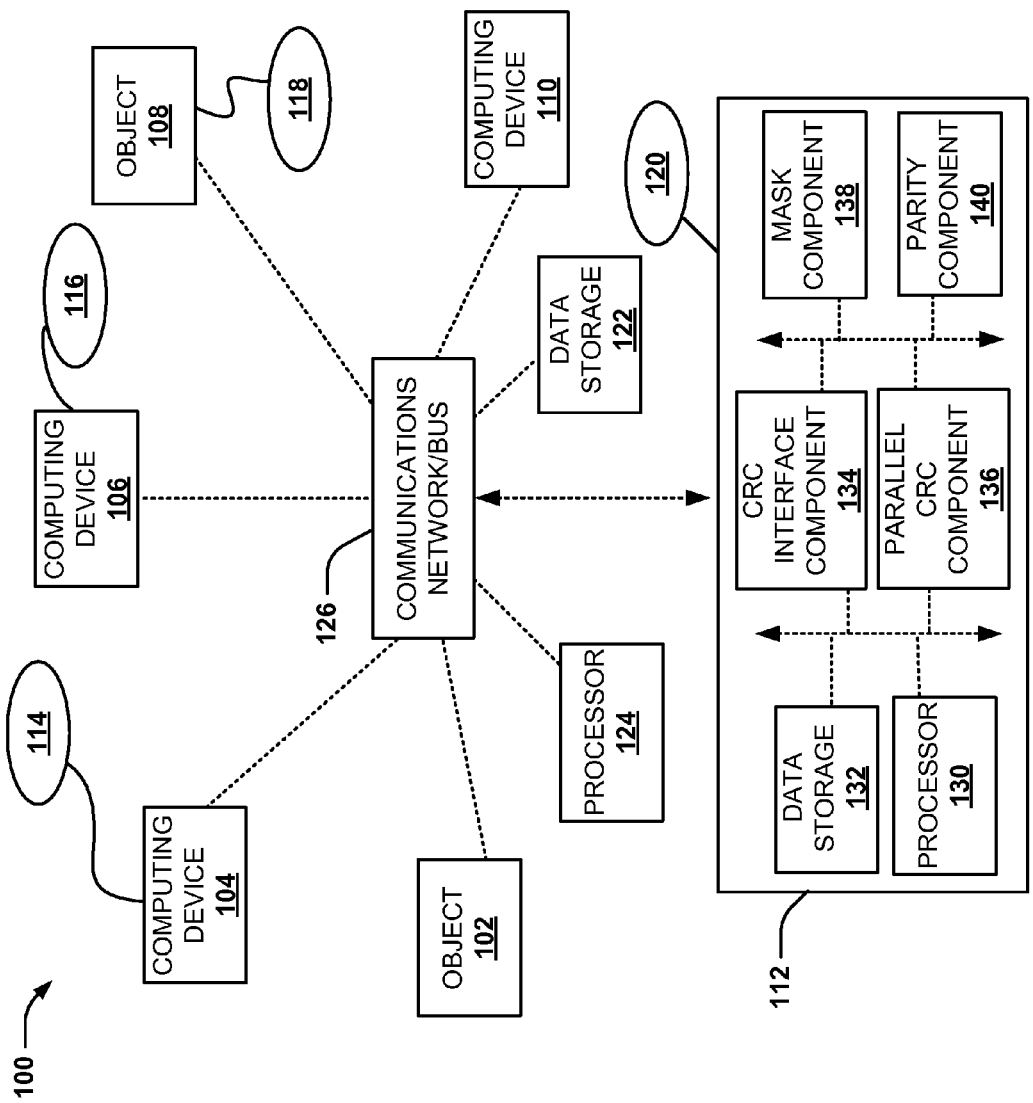
FIG. 1 illustrates a block diagram of a system for generating parallel CRC according to various aspects.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, an object, an executable, a program, a storage device, and/or a computer with a processing device. By way of illustration, an application running on a server and the server can also be a component. One or more components can reside within a process, and a component can be localized on one computer and/or distributed between two or more computers.

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

In consideration of the above described deficiencies, various aspects for generation of CRC can be based on parallel CRC generation methods, and replacing multiple exclusive-OR operations, XOR logic components, or other digital logic operations/devices with bit-mask and parity operations for faster processing via processing pipelines configured in parallel to one another.

A communication system, such as a parallel CRC system or an embedded microcontroller system, for example, can comprise a parallel CRC component that operates to generate parallel CRC codes based on a polynomial. A polynomial component is configured to facilitate polynomial calculations and communicate the polynomial to the parallel CRC component for generation of the parallel CRC codes. The polynomial component can define the properties of the CRC by generation of the polynomial as a function of polynomial parameters, such as a polynomial degree and variable coefficients, for example. To achieve a high throughput, the parallel CRC system is configured to process CRC via one or more interfaces with an N-bit wide data path, wherein N is an integer greater than one, so that multiple bits are processed in every clock cycle, such as, for example, a set of N bits comprising the width of the data path being processed concurrently for CRC coding.

The system can further operate to identify and substitute transmission gate devices or logic device operations for generation of a parallel CRC code, such as multiple exclusive-OR gate devices/operations with a bit-mask component and a parity component for performing masking and parity operations. The system can recognize particular logic operations, such as transmission gate or digital logic operations to be performed on input message data for generation of CRC output, and further reconfigure the logic operations to replace or utilize the logic device operations with a bit-mask operation and/or a parity operation. The bit-masking and parity operations can be performed on multiple bits at once, resulting in higher throughput than the transmission gate hardware/software alone for generation of CRCs in communication protocols among various communication system interfaces.

Referring to FIG. 1, illustrated is an example of a networked or distributed communication system 100 that can operate to communicate among various computing system components by processing CRC codes to ensure the integrity of transmission data. The system 100 comprises computing objects or computing devices 102, 106, 108, 110, 112, which can include programs, methods, data stores, programmable logic, and other processes, as represented by applications 114, 116, 118, 120. Computing objects 102, 108 or computing devices 104, 106, 110, 112 can comprise different devices, such as audio/video devices, sensors, actuators, computers, mobile devices, safety devices, microprocessors, controllers, embedded processors or other components that are communicatively coupled via a communications network, communication pathways, or bus 126, a processing device, or a memory/data storage 122, for example.

The computing objects 102, 108 and computing devices 104, 106, 110, 112 can communicate with one or more other computing objects 102, 108 and computing devices 104, 106, 110, 112 by way of the communications network 126, either directly or indirectly. Even though illustrated as a single element in FIG. 1, communications network 126 can comprise other computing objects and computing devices that provide services to the system 100, and can represent multiple interconnected networks, which are not shown. The computing object 102, 108 or computing device 104, 106, 110, 112 can also comprise an application, such as applications 114, 116, 118, 120 that can make use of an API, or other object, software, firmware and/or hardware, suitable for communication with or implementation of the shared communication systems provided in accordance with CRC generation, encoding and decoding of communication data.

The computing device 112 demonstrates further aspects for generation of CRC within the system 100. The computing device 112, for example, comprises a processor 130 and a data storage 132, which can be a controller that is communicatively coupled to a memory 122 within any one of the other objects or devices of the system 100. The computing device 112 can comprise a CRC interface component 134, a parallel CRC component 136, a mask component 138 and a parity component 140 that are communicatively coupled for generating CRC codes via one or more masking operations and parity operations, which can operate to substitute, replace, or interchange the functioning of exclusive-OR operations in a parallel CRC generation.

The CRC interface component 134 is configured to receive an input message comprising an array of bits via a data pathway. The input message, for example, can be data, such as sensor data, actuator data, a select message, or any data comprising a bitmap, bit set, bit string or bit vector that compactly stores N-bits, in which N can be an integer greater than one, such as a set of 8 bits or other bit size, for example. The array can be a subset of the domain (e.g. {0, 1, 2, . . . , n-1}), where a 1 bit indicates a number in the set and a 0 bit a number not in the set, or vice versa. This data set structure can utilize approximately N/W words of space, where W is the number of bits in each word, in which the least significant bit or the most significant bit can indicate the smallest-index number.

The data path of the CRC interface component 134, for example, can be N-bits wide for receiving multiple streams or bits of data at once, concurrently, simultaneously, or at about the same time. The CRC interface component 134 can be coupled to a parallel communication path, a system or communication bus having multiple paths (e.g., serial data paths) communicating together, multiple streams of data that can be transmitted together, or a parallel data path. As stated above, the CRC interface component 134 can be configured to receive data such as the input message and the CRC previous output at an N-bit wide pathway, in which multiple bits can be received together. In cases where the receive pathway of the CRC interface component 134 is not wider than a single bit, a bottleneck can potentially occur. To this end, the CRC interface component 134 is configured to process CRC codes for data transmission checksums at rates greater than a single bit or more.

The data path can also comprise a serial data path, for example, in which multiple paths are configured together for receiving more than one bit, such as with a data input message comprising the N-bit array of bits, or other data paths, such as parallel data paths, bus pipelines or other data path types capable of communicating multiple bits at once.

The data input paths for a previous CRC output and an input message including an array of bits can be different or similar. For example, the inputs can receive data at the CRC interface component 134 from paths of different widths or N-bit data paths with N being greater than one and a different value from among the data paths.

The CRC interface component 134 can be configured to receive a CRC previous output, which is constructed from the output of the parallel CRC component 136. The CRC interface component 134 can operate to feed back the output as a CRC previous output to the inputs of the parallel CRC component 136 at a different clock cycle than a CRC current output of the parallel CRC component 136. The CRC interface component 134 can further combine the output of the CRC previous output with the data input message being received.

The communication system 100 can operate a parallel CRC system within other communication systems such as an embedded microcontroller system that communicates data among components via the parallel CRC component 136. The parallel CRC component 136 further operates to generate parallel CRC codes based on a polynomial and with multiple data bits at once, concurrently, simultaneously, or at about the same time being processed for CRC encoding, or decoding of the message data. The generation processes of the parallel CRC can occur as a function of the inputs (e.g., the input data message, and the CRC previous output data fed back from the CRC current output), which are communicated by the CRC interface component 134 to the parallel CRC component 136.

The system 100 can further operate to substitute transmission gate devices or digital logic operations that operate for generating parallel CRC codes for data messages. For example, exclusive-OR operations/gate devices utilized for the generation of CRC codes for data transmission can be identified based on a function of the input data and processed with a bit-mask component and a parity component for performing masking and parity operations. The system can recognize particular logic operations, such as transmission gate or digital logic operations to be performed on input data for generation of CRC output, and further reconfigure the logic operations to utilize or replace the gate devices that would implement such operations with a bit-mask operation and/or a parity operation, for example.

The mask component 138 can be configured, for example, to generate a bit-mask and derive a mask result of the input data and the CRC previous output data. The parity component 140 can be configured to receive the mask result from the mask component 138 and provide a parity operation to the mask result. The parity component 140 generates a parity of the mask result for further communication of the input data message with a parallel CRC code as an integrity check to the transmitted communication. The masking operations and the parity operations can be performed on multiple bits at once, resulting in higher throughput than the transmission gate hardware/software alone for generation of CRCs in communication protocols among various communication system interfaces.

The CRC interface component 134, the parallel CRC component 136, the mask component 138 and the parity component 138 of the system 100 can operate in conjunction, or individually in order to eliminate all or at least a portion of bits of the data input (input data message) and previous CRC (CRC previous output), which are determined as not relevant to an exclusive-OR operation for parallel CRC calculation. Then, the data input and previous CRC value can be logically ANDed with a mask value via the masking component 138, such as with a logic "1" in the bit mask position of each bit that should participate in the exclusive-OR operation. Mask bit positions, which contain a value of "0," can convert corresponding bits of the data input and previous CRC to zero, which removes their influence on the final CRC result. In addition, individual logic operations can be recognized or determined for the generation of CRC codes according to the input message data and the previous CRC output. For example, the components can recognize that individual exclusive-OR operations are to be implemented for parallel CRC output generation, and then, replace one or more of these logic operations by a parity operation or calculation via the parity component 140.

For example, considering a set of bits B={b7, b6, b5, ... b0} for the bit set B, the multiple exclusive-OR operation b7 XOR b6 XOR b5 XOR ... b0 is mathematically equivalent to parity(B). The calculation of parity for a set of bits can be faster than individual exclusive-OR operations. In many cases, CPUs contain dedicated hardware for calculating parity, allowing the system 100 to realize additional optimization. In one aspect, parity operations can add one or more bits to the mask results of the masking operations to further enable data integrity of a transmission. The parity operations can provide one or more bits as a function of the CRC polynomial, for example, or one or more parameters of a polynomial of the CRC calculation operations.

The parallel CRC component 136 is configured to then generate specific types of CRCs faster, and with less memory than state of the art software methods. Able to be flexible, the system 100 can operate with the CRC parallel component with arbitrary CRC polynomials and message widths to dynamically update CRC generation (CRC current output) according to different CRC polynomials and message widths received as message input data. For example, small CRC polynomials (e.g., approximately 8-bits or less) can be advantageously generated within embedded systems, as well as small messages (e.g., approximately 32-bits or less). The components of the system 100 can further generate CRC in cases where the CRC polynomial or message bits are not the natural computing size of 8-bits, in which traditional methods can suffer performance losses in these cases.

Figure 2:
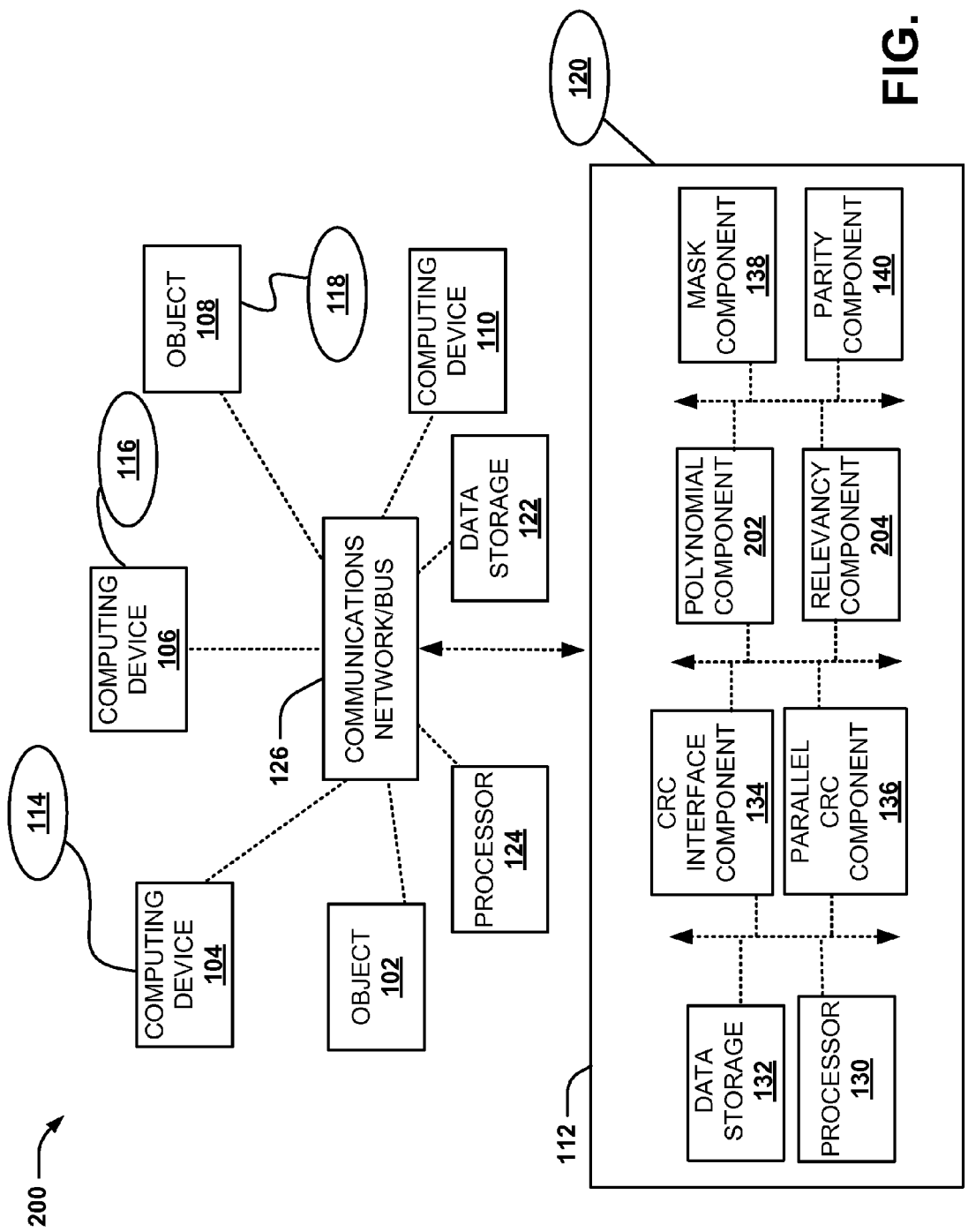
FIG. 2 illustrates a block diagram of another system for generating parallel CRC according to further aspects.

Referring to FIG. 2, illustrated is a system 200 for generating parallel CRC for communications among various device components. Similar components described above are illustrated as well as a polynomial component 202 and a relevancy component 204 communicatively coupled within the system 200.

The polynomial component 202 can operate to generate the polynomial and communicate the polynomial to the parallel CRC component 136 for generation of the parallel CRC codes. CRC code generation involves computing a remainder of a long division operation, such as the remainder of a modulo-2 long division operation. The polynomial component can define the properties of the CRC by generation of the polynomial as a function of polynomial parameters, such as a polynomial length and variable coefficients, for example, which can be predefined, identified or configured within the polynomial component 202. For example, multiple different polynomials can be configured for communication among different computing objects or computing devices 102, 104, 106, 108, 110, etc. depending upon different communication standards, device protocols, or product manufacturing. Thus, the polynomial component 202 can operate to utilize a different polynomial based on the device, or object communication within the system 200.

In another aspect, the polynomial component 202 can be configured to dynamically determine the polynomial to be utilized for communication with a particular device. For example, systems can be updated or modified with different software, protocols, checks, or hardware that can either be programmed within the polynomial component 202 for CRC computation with the particular update or dynamically defined automatically by communicating with the newly added device or update to retrieve or adapt a polynomial for further communications among the system 200 with the newly added device or update. Communication interfaces among embedded systems, for example, can operate with relatively low amounts of data. Such low rate interfaces are suitable and cost effective for exchanging sensor and system information. However, the data generated by sensors and the number of sensors present in systems is increasing and can be further subject to errors in transmission in communication networks without the polynomial component 202 of the integrity generation being able to dynamically accommodate, detect, and generate data integrity with or without human intervention.

The system 200 further comprises a relevancy component 204 that is configured to further operate or process CRC computations for data integrity assurances. The relevancy component 204 can be configured to determine a relevancy of the bits within the data being received, the inputted data message, bit array or the previous CRC output being received as feedback data. For example, bits can be determined to be relevant based on a determination of whether the bits comprised within the inputted data of the CRC interface component 134 affect the CRC output result being generated or not. In response to a determination that a bit or bits does affect the CRC output, the bit can be maintained within the processing pipelines of the parallel CRC component 136. Alternatively, in response to a determination that a bit or bits does not affect the CRC output, the bits can be eliminated from further processing of the CRC output.

Figure 3:
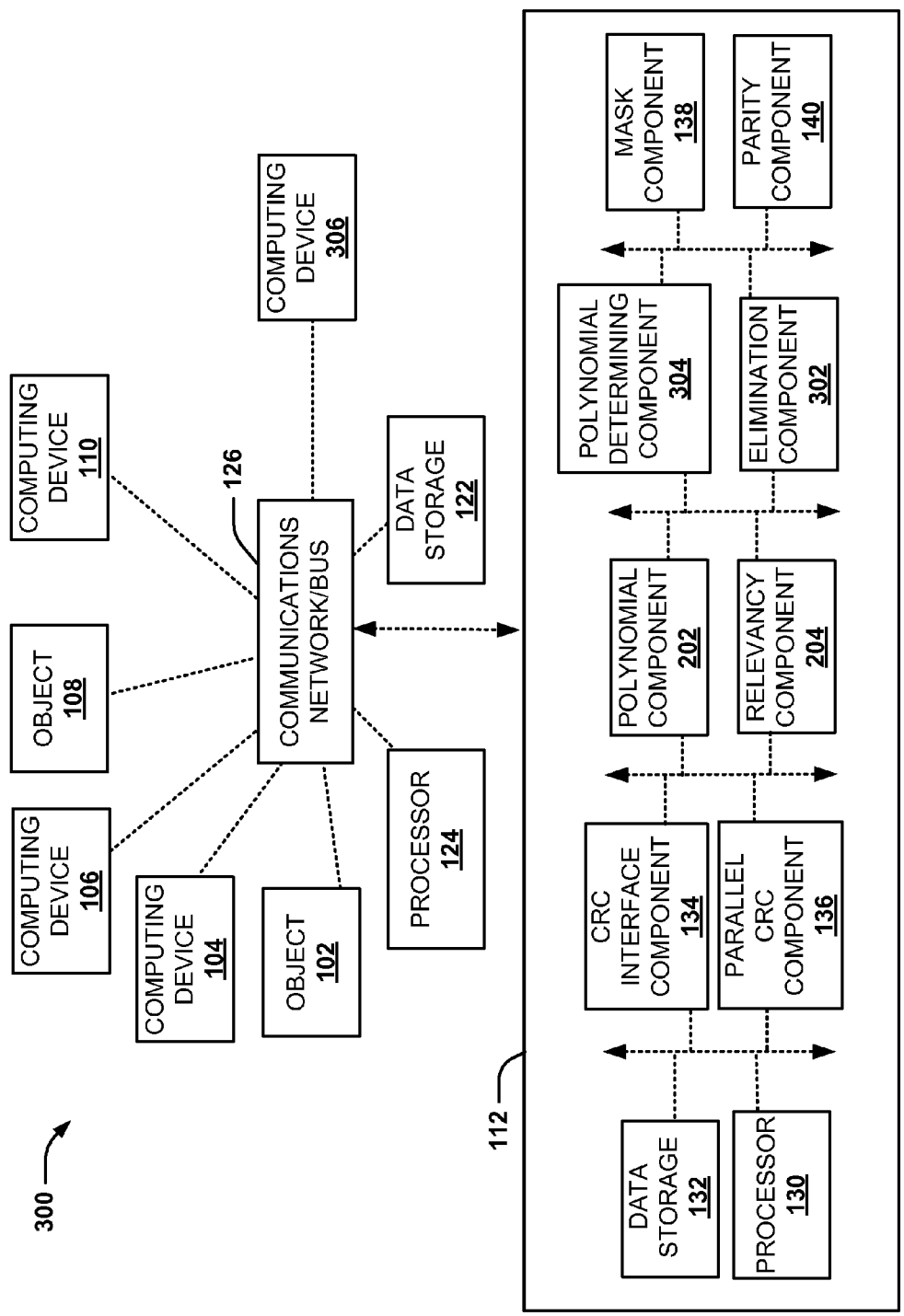
FIG. 3 illustrates a block diagram of another system for generating parallel CRC according to further aspects.

Referring now to FIG. 3, illustrated is another example of a system 300 with components that operate to ensure data integrity among communications. The system 300 comprises similar components as above and includes an elimination component 302 and a polynomial generation component 304. The system 300 further comprises a new or additional device 306, such as an actuator, sensor, processing device or the like component.

The elimination component 302, for example, is configured to eliminate data input bits and any previous CRC bits, which are determined to not be relevant to the output generation of the parallel CRC codes generated via the parallel CRC component 136. For example, bits determined by the relevancy component 204 to not be affected by a logic operation such as an exclusive-OR, other transmission logic device/operation, or digital logic devices that formulate or function as a XOR logic device, for example, as part of the parallel CRC system can be identified and eliminated by the elimination component 302. The elimination component 302, for example, is configured to generate a determination of which logic devices among the parallel CRC generated by the parallel CRC system are relevant based on a predetermined function, for example. The predetermined function can comprise one or more parameters related to, for example, width, the inputs, the message data, previous output/input size, and the like. Based on the determination, the elimination component 302 is configured to perform the elimination operations on a plurality of bits concurrently, at the same time, or simultaneously, resulting in an improved performance of the CRC coding within communication systems or communication environments.

In response to an elimination of the irrelevant bits of data from the input data message, as constructed from the previous CRC output and input message bits, for example, the parallel CRC component 136 can operate to logically AND, via an AND gate or an AND logic operation equivalent, the data input (bit array) and the previous CRC value with a mask value. For example, the bits from those deemed relevant can be masked with a logic "1" in the bit mask position of each bit, in which participate in the exclusive-OR operation. Mask bit positions that contain a value of "0," for example, can serve to convert corresponding bits of input message data (e.g., the data input and previous CRC) to zero, which can thereby remove their influence on the final CRC result (current CRC output) for error-free communication.

In addition, individual exclusive-OR operations that would normally generate the parallel CRC can be replaced by a more optimized parity calculation via the parity component 140. One example, considers a set of bits B={b7, b6, b5 ... b0}. For the bit set B, the multiple exclusive-OR operation b7 XOR b6 XOR b5 XOR ... b0 is mathematically equivalent to parity (B). The calculation of parity for a set of bits is generally faster than individual exclusive-OR operations. Furthermore, in many cases, computer processing units, processing devices, or the processor 130 of the system 300 can comprise dedicated hardware for calculating parity, allowing the realization of additional optimization compared to traditional techniques. Consequently, with ever expanding systems, their automation, dynamic and quick-time upgrade and adaptive systems, additional hardware, system down-time, hardware re-configuration, and upgrade, etc., is not always feasible. Thus, fast, efficient, and dynamic solutions for continued integrity is demanded.

The polynomial determining component 304 illustrates another example for enabling unique adaptation and generation of parallel CRC in system communications. The polynomial determining component 304 can operate to predetermine a polynomial that could be related to a device component, such as the computing device 306, which can be a new device, upgrade component, or any other component upgraded to the system 300, which can communicate among other coupled components. The polynomial determining component 304, for example, can be configured to communicate the polynomial to the parallel CRC component 136 or the polynomial component 202 to process a sample, or at least a part of the input message, the array of bits, previous CRC output, or other data as a function of the polynomial for CRC implementations.

Figure 4:
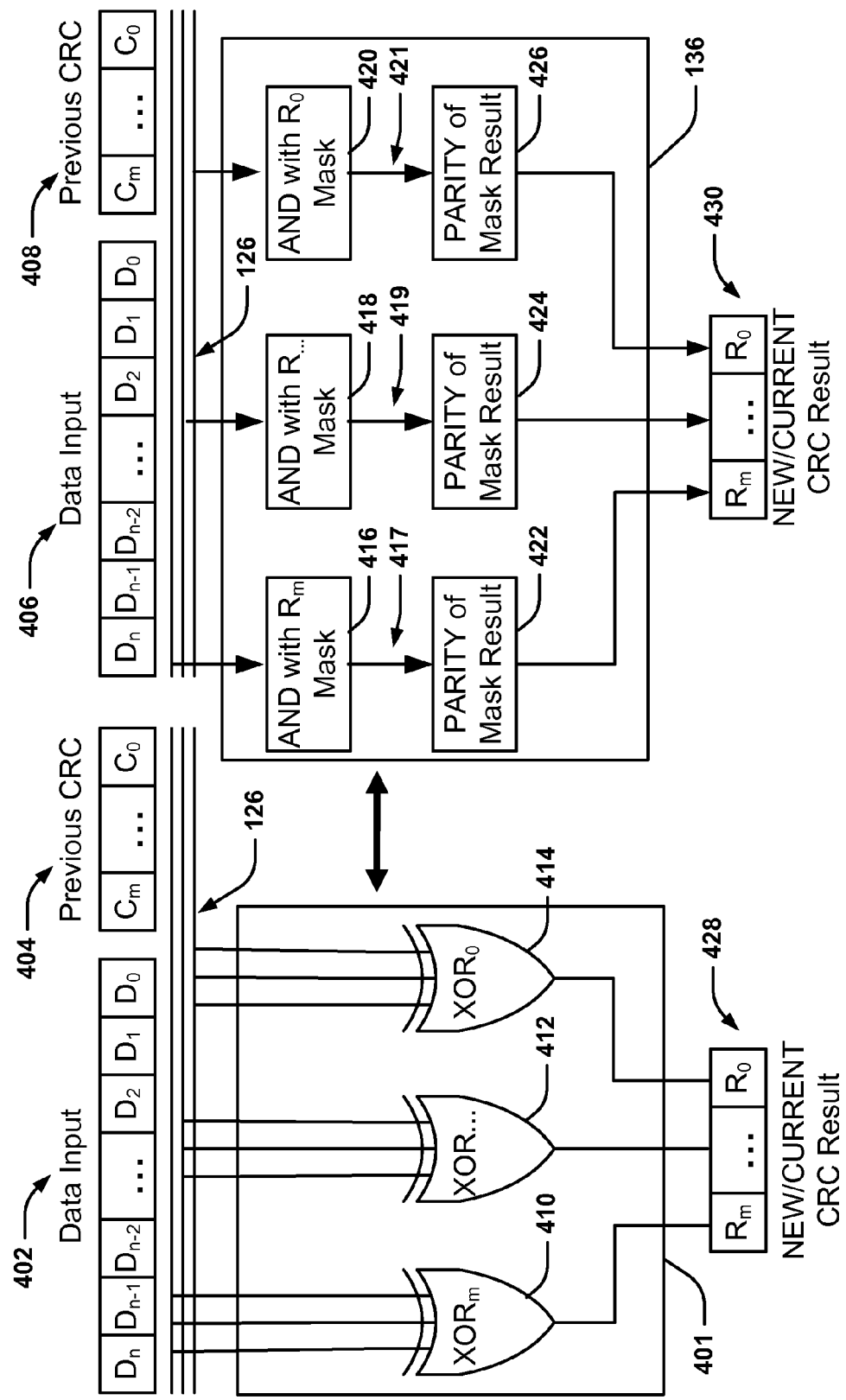
FIG. 4 illustrates a parallel CRC component of a system for generating parallel CRC.

Referring now to FIG. 4, illustrated is an example of the parallel CRC component 136 for generation of CRC data for one or more communication systems, in conjunction with a parallel CRC component 401, or alternatively independent from the parallel CRC component 401 as illustrated and described in above examples. The parallel CRC component 136 is configured to generate a CRC current output 430 via a plurality of parallel processing pipelines 417, 419, 421 that are configured to concurrently process a set of inputs for an input data message to be communicated, as discussed above, and can operate substantially similar to the parallel CRC component 401, but without one or more particular logic gate devices (e.g., XOR gates, or the like). For example, the logic gate devices 410, 412, 414 can be replaced/substituted by one or more mask components 416, 418, 420 and one or more parity components 422, 424, 426 of different processing pipelines 417, 419, 421 in order to perform substantially similar operations/processing steps/transformative action on the input data for CRC computation and generation. The parallel processing pipelines 417, 419, 421 of the parallel CRC components 136 and 401 can comprise one or more various architectures comprising different configurations of the mask components 416, 418, 420 and parity components 422, 424, 426, and hardware/software for generating parallel CRC output 430. Although two different components are illustrated, the systems described herein can, for example, and as described above, comprise just the parallel CRC component 136, which can further include components within both the parallel CRC components 136 and 401 for performing CRC computation and generation via software/hardware, or software operations with processing hardware.

Parallel CRC output can be generated as multiple CRC codes, bytes or CRC bits at once from multiple bits of input data. Software can be implemented in conjunction with hardware logic devices, or alone via the different device components of the systems described herein. In one aspect, parallel CRC can be a function of a next state (previous state CRC output) and the data input that is to be transmitted with CRC code or CRC checksum data. In addition, previous CRC output can be a function of the current output CRC generated by the parallel CRC component 136. The previous CRC output can, for example, be a function of a different time period than the current CRC output and/or different input data having more than one bit of data, for example. The previous CRC output can also be substantially the same to the current CRC output, such as, for example, where multiple processing cycles of the received input message are performed to process CRC output generation for a given received message or portion of a data stream.

Multiple bits or N-bits, for example, can be processed at each clock cycle concurrently so that an N-bit wide data path 126, for example, providing input data can be processed with CRC output. The number of data paths can be less than or more than N-bits of the data path capacity, process more than one bit along each parallel pipeline or path, and can also feed back multiple times for processing remaining bits of data at the input at greater speeds than non-parallel CRC. In addition, the parallel CRC generation can operate with arbitrary data and polynomial widths, and is able to receive any data width (not only a power of 2) in order to accommodate various input data widths and message widths, for example.

The parallel CRC component 136 and 401 can each process at least a part of the array of bits and the CRC previous output as an input message that combines the two data inputs. For example, the parallel CRC component 401 generates parallel CRC output 428 with a set of parallel CRC logic operations of logic gates 410, 412 and 414, such as X-OR/exclusive OR gates from a data message having data input 402 and previous CRC 404. In one aspect, an initial seed value can be provided to generate an initialized previous CRC input to ensure that the current output CRC is a value other than zero.

In addition or alternatively, the parallel CRC component 136 can receive inputs comprising input data 406 and previous CRC output 408 along the N-bit wide data path 126. The data inputted such as the input data 406 that comprises a communication message to be transmitted or received can be combined with the previous CRC output and a Mask value via an AND operations of mask components 416, 418, 420. Each AND operation of mask components 416, 418, 420 can combine one or more portions or subsets of the inputted data at once, in which each portion can comprise multiple bits, with a mask value to generate a mask result or a set of mask results.

For example, portions of the data input 406 and the previous CRC can each be ANDed at an AND operation with a mask value, such as a logic "1" that would otherwise would have participated in an exclusive-OR operation 410, 412, 414.

In one example, bits that are deemed irrelevant to the final generation of CRC are discarded from the combined data of the data input 406 and previous CRC 408. Bits, for example, can then be processed by the AND operations of mask components 416, 418, 420 with mask values to generate a set of mask results (e.g., a set being one or more). Each bit that should be generated, participate or result in a corresponding exclusive-OR operation is provided with a mask value such as a logic "1". Mask bit position with a value of "0" can convert corresponding bits of the data input and previous CRC to zero in order to remove their influence on the final CRC result.

Further, where individual XOR or exclusive-OR operations are identified as part of the CRC generation process, these operations can be replaced, substituted or interchanged with the masking operations of masking components 416, 418, 420 and parity operations via the parity components 422, 424, 426 that can perform a parity on the mask result generated.

The calculation steps to compute a new CRC output bit, for example, can be as follows:
A. Construct a binary input message (MSG_IN), which comprises the concatenation of the CRC data input (Data_In) and initial CRC value (CRC_Prev); B) Calculate mask result (MASK_RES)=(MSG_IN) logic-AND (MASK), where value MASK is pre-determined from the parallel CRC generation; and C) Calculate CRC output bit(s) (CRC_Out)=parity(MASK_RES).

Figure 5:
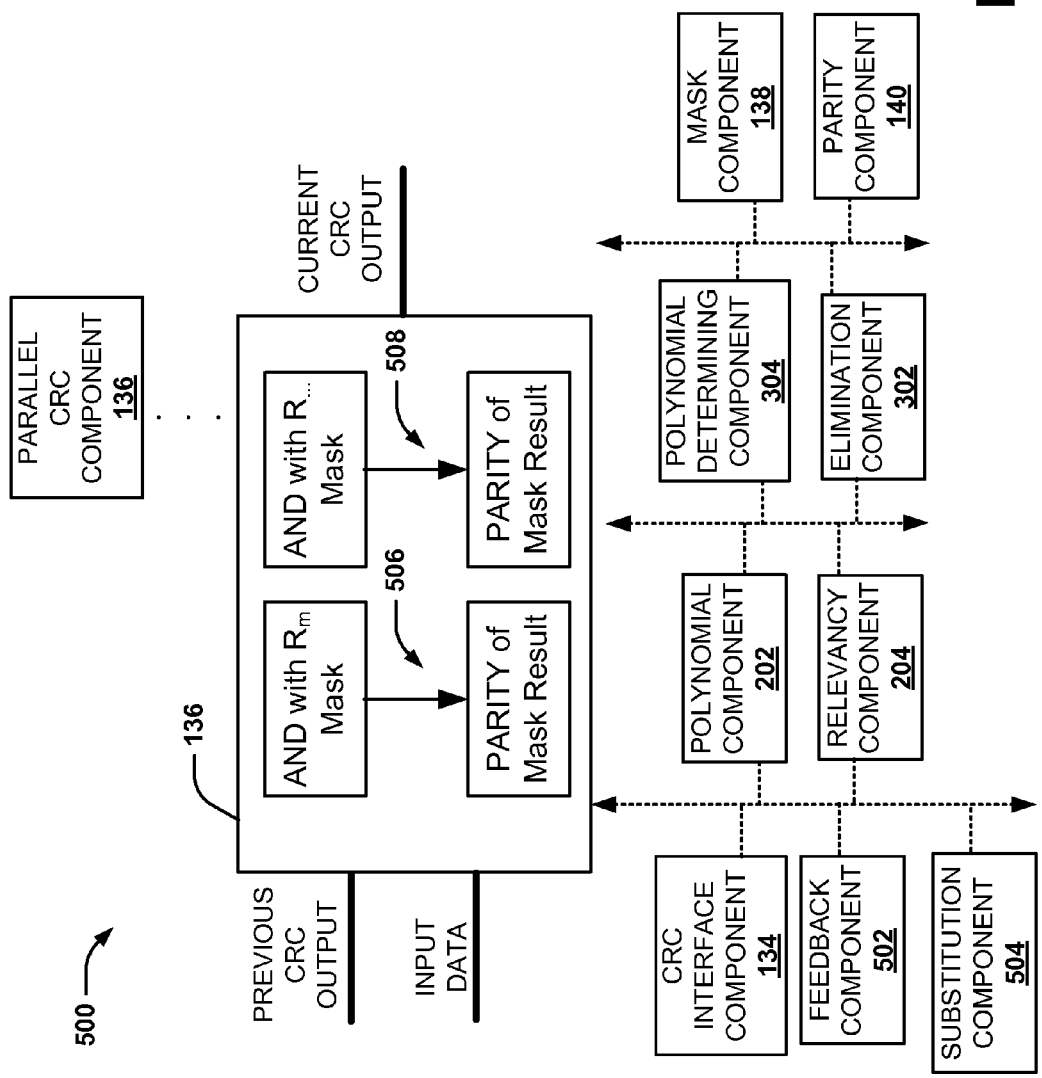
FIG. 5 illustrates another block diagram of a system for generating parallel CRC according to further aspects.

Referring to FIG. 5, illustrated is a further example of a system 500 for generating CRC according to various aspects disclosed. The system 500 comprises similar components as described above, and further includes a feedback component 502 and a substitution component 504.

In an aspect, the substitution component 504 is configured to identify an exclusive OR operation from among the set of parallel CRC logic operations that potentially generates a CRC output based on a polynomial and substitute the exclusive OR operation with the set of masking operations. For example, where an exclusive-OR operation is identified for processing input messages with CRC, the substitution component 504 can facilitate substituting hardware logic devices or operations with one or more parallel CRC component 136 operations for generating multiple bit paths, or multiple N-bit paths, with CRC. As systems expand, update and dynamically improve, the hardware for generating CRC (e.g., devices 410, 412, 414) can be a bottleneck. However, the substitution component 504 can identify the need and simultaneously or concurrently substitute the masking operations, and subsequently, the parity operations of the mask results based on changing demands.

Additionally, the parallel CRC component 136 comprises a plurality of parallel CRC components coupled to accommodate CRC generation for data inputs (e.g., input data and previous CRC output) of different widths, or for receiving wider data paths and concurrently generating CRC within multiple different pipelines. For example, the parallel CRC component 136 can comprise a first processing pipeline 506 and a second processing pipeline 508, as well as additional processing pipelines that can comprise a processing device (e.g., controller, microprocessor) operating for, or corresponding to, all of the pipelines 506, 508 associated with each component 136, all components 136, or multiple processing devices can operate, or correspond to, each pipeline 506 and 508 of each parallel CRC component 136 with a plurality of processing devices.

Furthermore, the parallel CRC component 136 can comprise multiple parallel CRC components 136 operating along each pathway to AND relevant bits of the input message (input data and previous CRC output) with a mask value, which is predetermined according to a function of a polynomial, the input message, data path, CRC computations, other CRC variables or one or more logic device operations. Additionally, the parallel CRC components 136 can be configured in parallel and operate to generate CRC by a parity of the mask results generated from the masking operations with a mask value. These functions can occur within each processing pipeline, in which more pipelines can be configured within each component and additional components coupled together depending on various architectures for generating Current CRC output.

The feedback component 502 of the system 500 can be configured to generate the CRC previous output as a function of the CRC current output with a clock component (not shown) configured to generate a clock cycle for each output. The feedback component 502 can communicate the CRC previous output to the parallel CRC component 136 at an input of the previous CRC output to the parallel CRC component 136. The previous CRC output input can then be utilized or combined with the input data received in order to construct a message data or input message that is then processed with CRC.

Referring to FIG. 6, illustrated is an example coding process for the generation of parallel CRC. The coding abstract comprises an optimized C language implementation of this flow process on a microcontroller device. For example, a CRC3 calculation is demonstrated with polynomial $X^3+X^1+1$, and a 29-bit input message. The mask values in this example can be obtained from predetermined function of the CRC output, the data message and/or the polynomial parameters for generating the CRC (e.g., coefficients, width of data, degree, etc.). The following terms are used to denote the CRC inputs and outputs: Data_In[x]: An array of x number of bits, representing the CRC input message; CRC_Prev[y]: An array of y number of bits, representing the previous CRC output; CRC_Out[y]: An array of y number of bits, representing the new CRC output; and Poly[y]: An array of y number of bits, representing the CRC polynomial. A new CRC output can be generated by the exclusive-OR combination of select previous CRC outputs and data inputs. In a generalized form, one CRC output bit can be expressed as: CRC_Out[a]= CRC_Prev[b] XOR CRC_Prev[c] XOR . . . CRC_Prev[d] XOR Data_In[j] XOR Data_In[k] XOR . . . Data_In[l], where the index numbers b . . . d and j . . . l are determined from a polynomial Poly[y].

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. Reference may be made to the figures described above for ease of description. However, the methods are not limited to any particular aspect, embodiment or example provided within this disclosure and can be applied to any of the systems disclosed herein.

Figure 7:
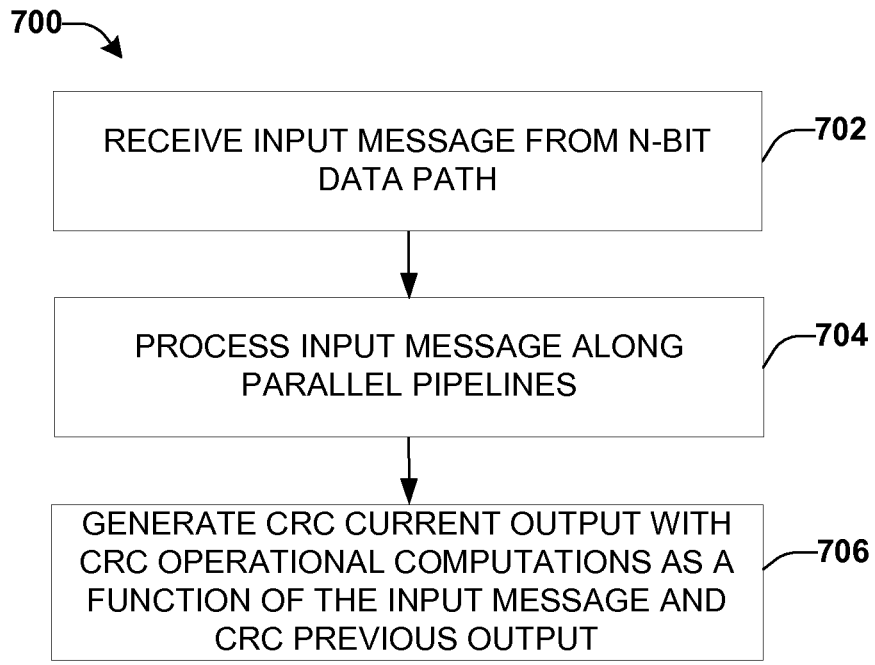
FIG. 7 is a flow diagram illustrating a method of generating parallel CRC for communications.

Referring to FIG. 7, illustrated is an example process flow for generating parallel CRC. A method 700 initiates and comprises at 702 receiving, via a processing device of a communication system, an input message comprising an array of bits from an N-bit data pathway, and a CRC previous output, wherein N comprises an integer greater than one, such as via the CRC interface component 134 discussed above. The input message can comprise the array of bits as the message data, or the input message can be considered the array of bits and the CRC previous output concatenated together as the input message.

At 704, the process flow continues with processing at least a part of the array of bits of the input message and the CRC previous output concurrently along parallel processing pipelines with a set of CRC operational computations (e.g., via the parallel CRC generation component 136). The processing of the at least the part of the array of bits can comprise identifying a set of logic gate operations of the set of CRC operational computations that generate the CRC current output and performing a mask operation and a parity operation as a substitution for at least one of the set of logic gate operations, such as with one or more exclusive-OR operations. The processing of the at least the part of the array of bits further comprises substituting one or more exclusive-OR operations identified from the set of logic gate operations with the mask operation to generate a mask result and the parity operation to generate a parity of the mask result. In other aspects, the method 700 can include generating a determination of whether bits from the array of bits and the CRC previous output affect generation of the CRC current output as related to an exclusive-OR operation of the set of logic gate operations, and eliminating the bits from the array of bits and the CRC previous output based on the determination. For example, in response to bits being identified to be irrelevant in an exclusive-OR operation message, these bits can be eliminated. If no irrelevancy is determined, then no elimination is performed. Alternatively or additionally, bits being determined as relevant, can be kept from or designated for prevention of elimination and further processed.

At 706, the method comprises generating a CRC current output with the set of CRC operational computations of the parallel processing pipelines as a function of the input message and the CRC previous output.

The mask operation, for example, can include generating a mask result of the mask operation by performing a logical AND operation with the input message and a predetermined mask value that is a function of a polynomial of the set of CRC operational computations, which comprise computations for generating parallel CRC. The parity operation can be then performed on the mask result to generate a parity mask result. The parity mask result can then be communicated as at least a part of the CRC current output for a transmission of CRC data to a device component of the communication system. Further, the parity mask result can also be communicated to an input of the parallel processing pipeline or a parallel CRC component as at least a part of the CRC previous output based on a different clock cycle than the CRC current output and a set of remaining bits from the array of bits to be processed, such as bits waiting to further processed from the N-bit wide data path.

Generation of the CRC current output can comprise performing a polynomial operation on the input message that comprises a polynomial division with a selected or predetermined polynomial. The input message, for example, can be constructed by concatenating or combining the array of bits and the CRC previous output together.

Figure 8:
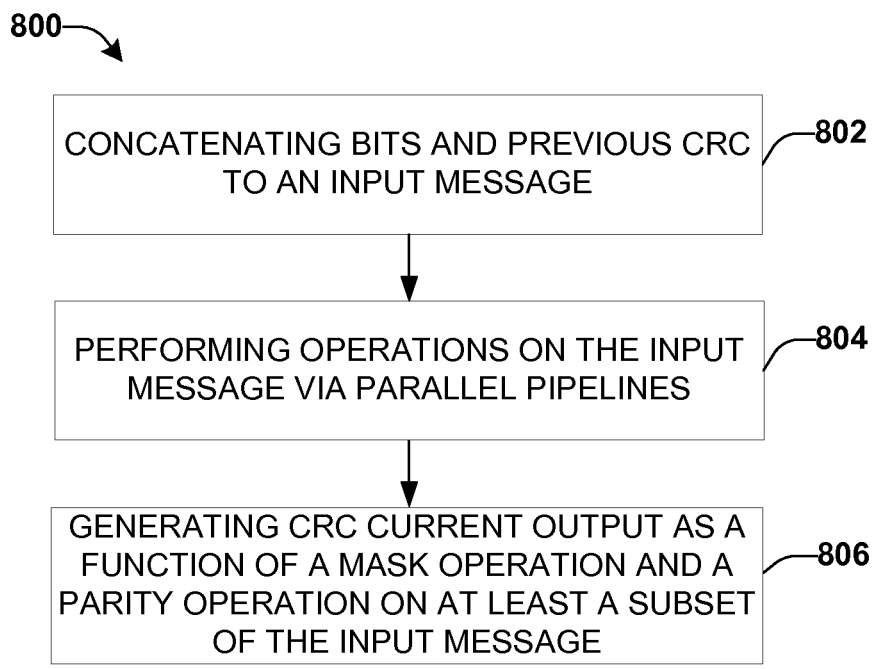
FIG. 8 is another flow diagram illustrating a method of generating parallel CRC for communications.

Referring now to FIG. 8, illustrated is a method 800 for generating parallel CRC according to various aspects described herein. The method initiates, and at 802 comprises concatenating an array of bits received via an N-bit data path and a cyclic redundancy check (CRC) previous output to generate an input message, wherein N comprises an integer greater than one.

At 804, a set of operations are performed on the input message via processing pipelines in parallel to one another and configured to concurrently process a portion of the input message respectively.

At 806, a CRC current output is generated as a function of a mask operation and a parity operation performed on a subset of the input message. The operational processes can include interchanging, substituting or replacing an exclusive-OR operation of the set of operations with the mask operation and the parity operation to generate the CRC current outputs. For example, bits that do not affect the CRC current output generation can be removed from the input message based on a predetermined function of an exclusive-OR operation. A mask result of the mask operation can be generated by performing a logical AND operation with the array of bits and a predetermined mask value based on a polynomial. Then, a parity mask result can be derived from performing the parity operation on the mask result.

The term "computer readable media" as used herein includes computer readable storage media and communication media. Computer readable storage media includes volatile and nonvolatile, removable and non-removable media implemented in any method or technology for tangible storage of information such as computer readable instructions or other data. Data stores or memory disclosed herein are examples of computer readable storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information.

The term "computer readable media" may also include communication media. Communication media typically embodies computer readable instructions or other data that can be communicated in a "modulated data signal" such as a carrier wave or other transport mechanism and includes any information delivery media. The term "modulated data signal" may include a signal that has one or more of its characteristics set or changed in such a manner as to encode information in the signal.

One or more of the operations described can constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for generating a cyclic redundancy check (CRC) of a communication system comprising:
   receiving, via a processing device of the communication system, an input message comprising an array of bits from an N-bit data pathway, and a CRC previous output, wherein N comprises an integer greater than one;
   processing at least a part of the array of bits of the input message and the CRC previous output concurrently along parallel processing pipelines with a set of CRC operational computations; and
   generating a CRC current output with the set of CRC operational computations of the parallel processing pipelines as a function of the input message and the CRC previous output;
   wherein the processing of the at least the part of the array of bits comprises identifying a set of logic gate operations of the set of CRC operational computations that generate the CRC current output and performing a mask operation and a parity operation as a substitution for at least one of the set of logic gate operations.

2. The method of claim 1, further comprising:
   generating a determination of whether bits from the array of bits and the CRC previous output affect generation of the CRC current output as related to an exclusive-OR operation of the set of logic gate operations; and
   selectively eliminating the bits from the array of bits and the CRC previous output based on the determination.

3. The method of claim 1, wherein the processing the at least the part of the array of bits further comprises substituting one or more exclusive-OR operations identified from the set of logic gate operations with the mask operation to generate a mask result and the parity operation to generate a parity of the mask result.

4. The method of claim 1, further comprising:
   generating a mask result of the mask operation by performing a logical AND operation with the input message and a predetermined mask value that is a function of a polynomial of the set of CRC operational computations.

5. The method of claim 4, further comprising:
   performing the parity operation on the mask result to generate a parity mask result; and
   communicating the parity mask result as at least a part of the CRC current output for a transmission of CRC data to a device component of the communication system.

6. The method of claim 5, communicating the parity mask result to an input of the parallel processing pipeline as at least a part of the CRC previous output based on a different clock cycle than the CRC current output and a set of remaining bits from the array of bits to be processed.

7. The method of claim 1, wherein the generating of the CRC current output comprises performing a polynomial operation on the input message that comprises a polynomial division with a polynomial.

8. The method of claim 1, further comprising:
   constructing the input message by concatenating the array of bits and the CRC previous output.

9. A system, comprising:
   a memory that stores computer-executable components; and
   a processor, communicatively coupled to the memory, that facilitates execution of the computer-executable components, the computer-executable components comprising:
      a cyclic redundancy check (CRC) interface component configured to receive an input message comprising an array of bits via an N-bit data pathway, and receive a CRC previous output, wherein N comprises an integer greater than one;
      a parallel CRC component configured to generate a CRC current output from a plurality of parallel processing pipelines that are configured to concurrently process at least a part of the array of bits and the CRC previous output with a set of parallel CRC logic operations;
      a mask component configured to generate at least a portion of the set of parallel CRC logic operations with a set of masking operations;
      a parity component configured to generate a set of parity operations that correlate to the set of masking operations; and
      a feedback component configured to generate the CRC previous output as a function of the CRC current output with a clock component configured to generate a clock cycle, and communicate the CRC previous output to the parallel CRC component.

10. The system of claim 9, wherein the mask component is further configured to provide an output to the parity component in each of the plurality of parallel processing pipelines and generate a mask result corresponding to each bit of the array of bits, and the parity component is further configured to generate a parity of the mask result.

11. A system, comprising:
    a memory that stores computer-executable components; and
    a processor, communicatively coupled to the memory, that facilitates execution of the computer-executable components, the computer-executable components comprising:
       a cyclic redundancy check (CRC) interface component configured to receive an input message comprising an array of bits via an N-bit data pathway, and receive a CRC previous output, wherein N comprises an integer greater than one;
       a parallel CRC component configured to generate a CRC current output from a plurality of parallel processing pipelines that are configured to concurrently process at least a part of the array of bits and the CRC previous output with a set of parallel CRC logic operations;
       a mask component configured to generate at least a portion of the set of parallel CRC logic operations with a set of masking operations;
       a parity component configured to generate a set of parity operations that correlate to the set of masking operations; and
       a polynomial component configured to perform a polynomial operation with the input message and generate the input message with a CRC value based on a polynomial.

12. The system of claim 11, wherein the polynomial component is configured to modify parameters of the polynomial in response to a change in a first communication of the input message from a first device component to a second communication of the input message from a second device component via the N-bit data pathway.

13. The system of claim 9, wherein the computer-executable components further comprise:
a polynomial determining component configured to predetermine a polynomial related to a device component that is communicatively coupled to the processor and communicate the polynomial to the parallel CRC component to process the at least the part of the array of bits as a function of the polynomial.

14. The system of claim 9, wherein the computer-executable components further comprise:
a relevancy component configured to generate a determination of whether one or more bits from the input message and the CRC previous output affect the CRC current output, and eliminate the one or more bits based on the determination.

15. A system, comprising:
a memory that stores computer-executable components; and
a processor, communicatively coupled to the memory, that facilitates execution of the computer-executable components, the computer-executable components comprising:
a cyclic redundancy check (CRC) interface component configured to receive an input message comprising an array of bits via an N-bit data pathway, and receive a CRC previous output, wherein N comprises an integer greater than one;
a parallel CRC component configured to generate a CRC current output from a plurality of parallel processing pipelines that are configured to concurrently process at least a part of the array of bits and the CRC previous output with a set of parallel CRC logic operations;
a mask component configured to generate at least a portion of the set of parallel CRC logic operations with a set of masking operations;
a parity component configured to generate a set of parity operations that correlate to the set of masking operations; and
a substitution component configured to identify an exclusive OR operation from among the set of parallel CRC logic operations that potentially generates a CRC output based on a polynomial and substitute the exclusive OR operation with the set of masking operations.

16. A system, comprising:
a memory that stores computer-executable components; and
a processor, communicatively coupled to the memory, that facilitates execution of the computer-executable components, the computer-executable components comprising:
a cyclic redundancy check (CRC) interface component configured to receive an input message comprising an array of bits via an N-bit data pathway, and receive a CRC previous output, wherein N comprises an integer greater than one;
a parallel CRC component configured to generate a CRC current output from a plurality of parallel processing pipelines that are configured to concurrently process at least a part of the array of bits and the CRC previous output with a set of parallel CRC logic operations;
a mask component configured to generate at least a portion of the set of parallel CRC logic operations with a set of masking operations; and
a parity component configured to generate a set of parity operations that correlate to the set of masking operations;
wherein the mask component is further configured to perform a logical AND operation with at least a part of the array of bits and at least a part of the CRC previous output.

17. A tangible computer readable storage medium configured to store computer executable instructions that, in response to execution, cause a computing system comprising at least one processor to perform operations, the operations comprising:
concatenating an array of bits received via an N-bit data path and a cyclic redundancy check (CRC) previous output to generate an input message, wherein N comprises an integer greater than one;
performing a set of operations on the input message via processing pipelines in parallel to one another and configured to concurrently process a portion of the input message respectively;
generating a CRC current output as a function of a mask operation and a parity operation performed on a subset of the input message; and
removing bits from the input message that do not affect the CRC current output based on a predetermined function of an exclusive-OR operation.

18. The computer readable storage medium of claim 17, the operations further comprising:
interchanging an exclusive-OR operation of the set of operations with the mask operation and the parity operation to generate the CRC current output.

19. The computer readable storage medium of claim 17, the operations further comprising:
generating a mask result of the mask operation by performing a logical AND operation with the array of bits and a predetermined mask value based on a polynomial; and
generating a parity mask result derived from performing the parity operation on the mask result.

* * * * *